United States Patent [19]

Michaels

[11] Patent Number: 5,736,675

[45] Date of Patent: Apr. 7, 1998

[54] APPARATUS FOR PROVIDING A HERMETICALLY SEALED ENVIRONMENT

[75] Inventor: Donald L. Michaels, Robins, Iowa

[73] Assignee: Rockwell International Corporation, Costa Mesa, Calif.

[21] Appl. No.: 526,348

[22] Filed: Sep. 11, 1995

[51] Int. Cl.$^6$ ........................................ H01J 5/00
[52] U.S. Cl. ........................ 174/50.5; 174/50.52; 220/3.8
[58] Field of Search ........................... 174/17 R, 50, 174/50.52, 50.5, 52.3, 59; 220/3.8, 4.02; 439/548, 559; 29/525.11, 527.1; 228/184, 193, 194

[56] References Cited

U.S. PATENT DOCUMENTS

| | | | |
|---|---|---|---|
| 3,644,878 | 2/1972 | Toedtman | 339/213 R |
| 3,736,104 | 5/1973 | Churchill et al. | 23/281 |
| 3,754,674 | 8/1973 | Wesoloski | 220/2.3 R |
| 3,904,812 | 9/1975 | Daffron | 174/52 S |
| 4,897,095 | 1/1990 | Bedi et al. | 55/279 |
| 4,994,631 | 2/1991 | Williams, Jr. | 174/67 |
| 5,280,412 | 1/1994 | Podell et al. | 361/710 |

*Primary Examiner*—Kristine L. Kincaid
*Assistant Examiner*—Dhiru R. Patel
*Attorney, Agent, or Firm*—Kyle Eppele; L. Keith Stephens; James P. O'Shaughnessy

[57] ABSTRACT

A device and a method of manufacture for the device, in which the device is a metallic canister having a detachable lid that is fastened onto the canister having an indium-tin intermetallic gasket disposed between the lid and the edge of the canister adjacent to the lid. Heating the entire apparatus at a predetermined temperature less than the melting point of indium-tin intermetallic for a specified time period such that the indium and a tin coating on the lid and canister surface interact to form an intermetallic compound that provides a seal which will satisfy operating requirements for being, designated a hermetic seal. The condition of the seal improves over time, due to the continued interaction between the tin and indium alloy.

8 Claims, 3 Drawing Sheets

APPARATUS FOR PROVIDING A HERMETICALLY SEALED ENVIRONMENT

FIELD OF INVENTION

The present invention relates generally to electrical packaging systems and more particularly to systems which are required to provide hermetic type sealing for enclosed devices.

BACKGROUND OF THE INVENTION

As a cost reduction measure, many new designs are employing plastic electrical components. The plastic components are not as environmentally robust as their ceramic encapsulated counterparts. In order to protect the plastic parts, the assembled unit must be sealed to provide protection, as often measured in accordance with established standards of less than or equal to 6,000 parts per million per volume (ppm/v). Prior art methods of providing such sealing, generally referred to as "hermetic sealing" are often either one or more of the following: laser welded, resistance welded, soldered or gasketed.

Welding is a fairly common method of sealing metallic packages and is generally accomplished in such instances via either laser welding or resistance welding. Laser welding provides excellent repeatable seal condition under many conditions. However, some applications require that the metallic packaging be of light-weight metal, such as aluminum. In such instances, aluminum-to-aluminum laser welding is exceptionally difficult to achieve at production rates. Aluminum's excellent thermal conductivity and high reflectivity make localized heating required for the weld seal between the two aluminum components exceptionally poor. Alternatively, resistance welding is often used, but also suffers similar deficiencies for aluminum-to-aluminum welding and is additionally sized constrained in most applications.

Solder seals are often used as a solution for hermetically sealing an aluminum-to-aluminum interface. Unfortunately, solder sealing requires the use of flux material, which often invades the enclosed area containing the device to be protected, often times causing contamination of such device. Additionally, solder sealing requires excessive localized heat, thereby increasing the cost of hermetically sealing the apparatus with such methods. Metallic gaskets have also been used, providing good seals, dependent upon the availability to maintain uniform sustained pressure, although inherent in the gasket seal is leakage, over time, between the gasket material and the lid element of the enclosing device.

Accordingly, it has been the goal of manufactures to provide hermetic sealing for various canisters of widely varying sizes, the hermetic seal being both reliable and inexpensive to produce.

SUMMARY OF THE INVENTION

The present invention constitutes a system and method for providing a hermetic sealed device for appropriately encased components, the device utilizing known materials and assembly practices. A metallic multiwalled structure having a separate mating lid and the appropriate electrical connections for a given component to be encased are described. Multiwalled structure as defined by this document refers to any geometry which produces a mating surface(s) that provide a long effective length for the sealed area. An indium gasket is disposed between the metallic multiwalled structure and the lid. The surface of the lid and the multiwalled structure that are in contact with the indium gasket are tin plated. A press operation is provided for physically complying the lid toward the multiwalled structure and thereby deforming (extruding) the indium gasket to completely plug all surfaces formed between the surfaces of the structure and the lid. The resultant gasket geometry has a minimal cross sectional area and a long effective length. Permanent fasteners are used for continued constraint of the lid to the structures. The entire assembly is subject to a controlled pre-selected heating process that is less than the melting point of the indium-tin intermetallic, for a given period of time, such as 100° C. for one hour minimum. During this heating process, the indium-tin interface begins molecular transformation to a unified metallurgical intermetallic layer at a prescribed rate. Subsequent heating that does not exceed the melting point of indium-tin intermetallic serves to further strengthen the layer by continued molecular transformation.

An alternate embodiment of the above apparatus discloses the inclusion of machined bosses at each fastener, thereby elevating mechanical stress on the seal.

It is an object of the present invention to provide an apparatus of varied geometries that is capable of being hermetically sealed.

It is a feature of the present invention to utilize metallurgical bonding properties of indium and tin under heat that transforms to an intermetallic structure.

It is an advantage of the present invention that a package device is disclosed in which the hermetic seal condition improves over time.

It is an additional advantage of the present invention that the ease of assembly of the present package device allows for increased use of plastic package discrete components, otherwise unacceptable for many applications.

These and other objects, features and advantages are disclosed and claimed in the Specification, figures and claims of the present application.

DESCRIPTION OF THE PREFERRED EMBODIMENT

Figure 1:
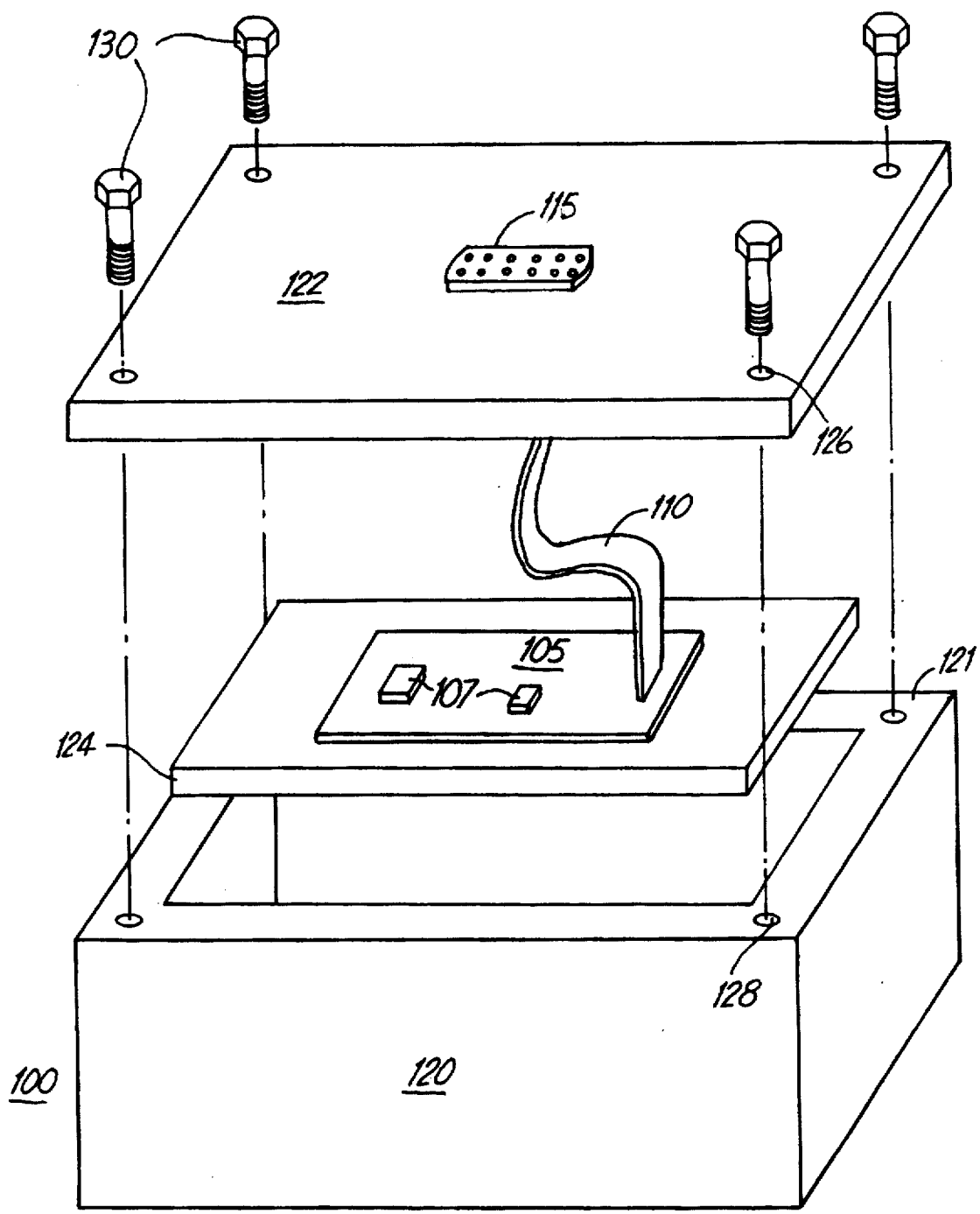
FIG. 1 illustrates an exploded perspective view of one embodiment of the present invention comprising a metallic canister having a lid and a hermetic seal.

Referring now to the drawings, wherein like items are referenced as such throughout, FIG. 1 illustrates an exploded perspective view of an apparatus 100 that incorporates the teachings of the present invention. An electrical component 105, such as a circuit card assembly having plastic encapsulated integrated circuits 107 represents the items to be encased and protected from environmental conditions. A multiwalled encasement structure 120, is designed of such dimension so as to accommodate and secure the component 105. It is understood that the multiwalled encasement structure 120 may take a variety of shapes, although shown as a rectangularly shaped structure permanently sealed on all sides with the exception of a removable lid element 122. Affixed to the lid elements are connectors 115 that provided electrical access to the component 105 via a connector cable 110. Alternatively, the connectors could be located on any surface of the multiwalled encasement structure 120, but are shown here on the lid element 122 as a preferred configuration for ease in assembling the entire apparatus 100. The multiwalled encasement structure 120 and lid 122 are of metallic composition such as aluminum and are tin plated in the area where the multiwalled encasement structure and the lid connect generally identified as surface 121. The tin plating along the coupling area of the lid and structure is necessary to form the indium-tin intermetallic bond for the environmental seal. The tin plating could cover the entire structure, but must, as a minimum be included along the areas described above.

The lid element 122 has a plurality of apertures 126, strategically located such that their location overlies similar apertures in the multiwalled encasement structure 120 when the lid is placed in position, forming a seal for the entire structure. The apertures in the multiwalled structure 120 may be threaded so as to accommodate a screw 130 that, once in place, provides ample pressure for retaining the lid element 122 securely in place. A layer of indium metal 124 is disposed between the top ridge 121 of the multiwalled encasement structure and the lid element 122.

Indium has a relatively low melting point, approximately 156° C., and is selected for its ability to interact with the tin plating on the lid element and multiwalled encasement structure under heating conditions lower than its melting point, thereby forming a permanent bond satisfying hermetic sealing conditions.

Figure 2:
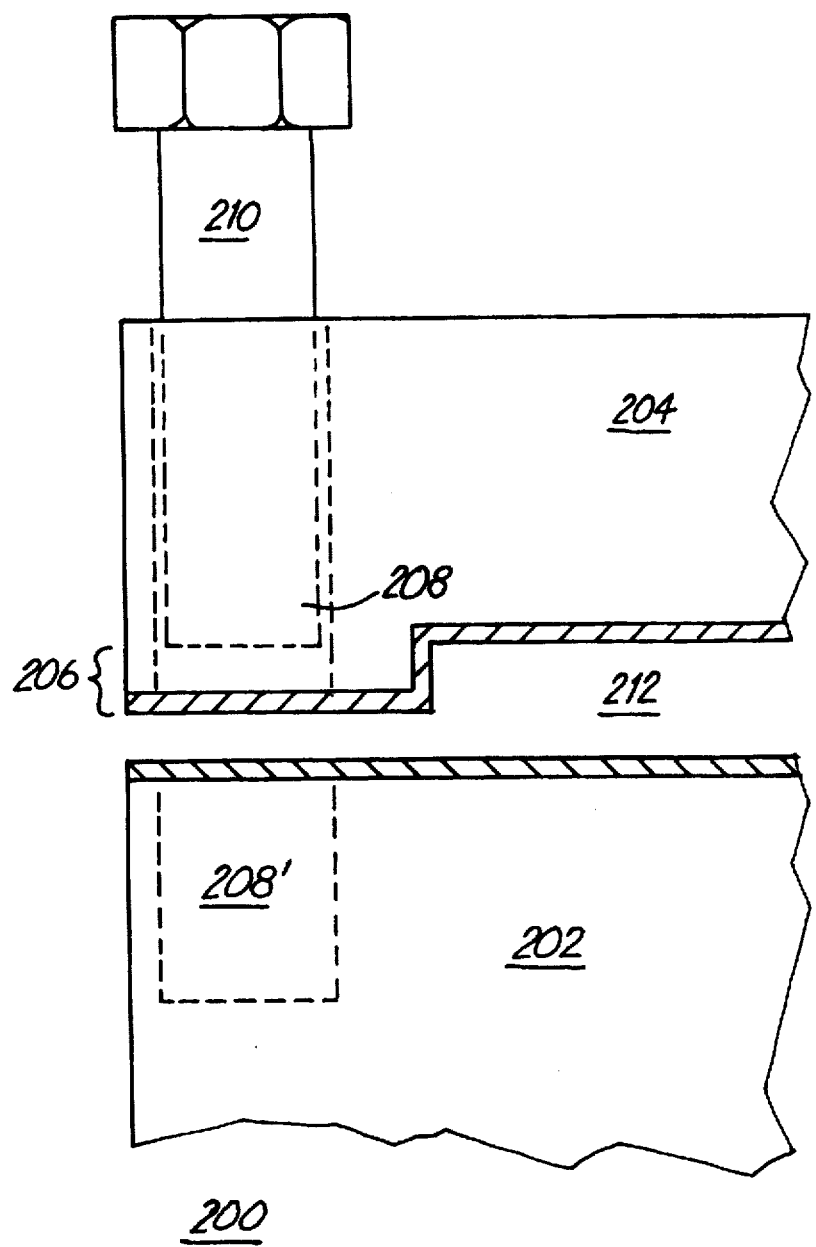
FIG. 2 illustrates an enlarged partial cross-section of a lid, canister and seal embodying the teachings of the present invention.

FIG. 2 illustrates an alternate embodiment 200 of the apparatus of FIG. 1, highlighting a partial cross-sectional view at the point of a single fastener. As shown, a multiwalled encasement structure 202 has a corresponding lid element 204. In this instance, the lid element has a boss 206, at the point of the aperture 208 and 208' that accommodates the fastener, screw 210. A layer of indium metal 212 is disposed once again between the lid element and the multiwalled lid element 204 and the multiwalled encasement structure 202. As with the apparatus in FIG. 1, the assembly depicted in FIG. 2 is mechanically held in place via the pressure of the fastener 210, properly and completely seated in aperture 208 and 208'. The entire assembly is then exposed to elevated temperatures for a predetermined period of time, such as one hour minimum, at a predetermined temperature, such as 100° to 105° C., thereby causing the indium-tin interface to transform to an intermetallic layer that provides environmental protection that meets or exceeds the 6,000 ppm/v moisture content constraint within the sealed device.

The process of heating the assembled structure serves a dual purpose of transforming the indium-tin interface into an intermetallic material, while simultaneously removing any residual moisture within the enclosed device (see FIG. 1) or within the walls of the encasement structure. In the case of the embodiment shown in FIG. 2, the boss element 206 serves to eliminate mechanical stress in the indium, thereby minimizing the possibility of poor intermetallic bond formation or subsequent failure during use, due to vibration or other forces. It is understood that the configuration depicted in FIG. 2 is repeated at each point of attachment, or each fastener utilized in the apparatus 200. It is also understood that although the time for baking the apparatus and the selected temperature are arbitrary, the selected temperature must always be safely below the melting point of the indium-tin intermetallic. Once the indium-tin intermetallic layer is formed, subsequent use of the apparatus 200, that may include subjecting the device to high temperature, merely serves to strengthen the intermetallic bond layer by increased indium-tin intermetallic growth. This feature of the present invention is contrary to previous methods of providing hermetic seals in which normal operating conditions generally serve to degrade the sealant effect of any given material.

Figure 3:
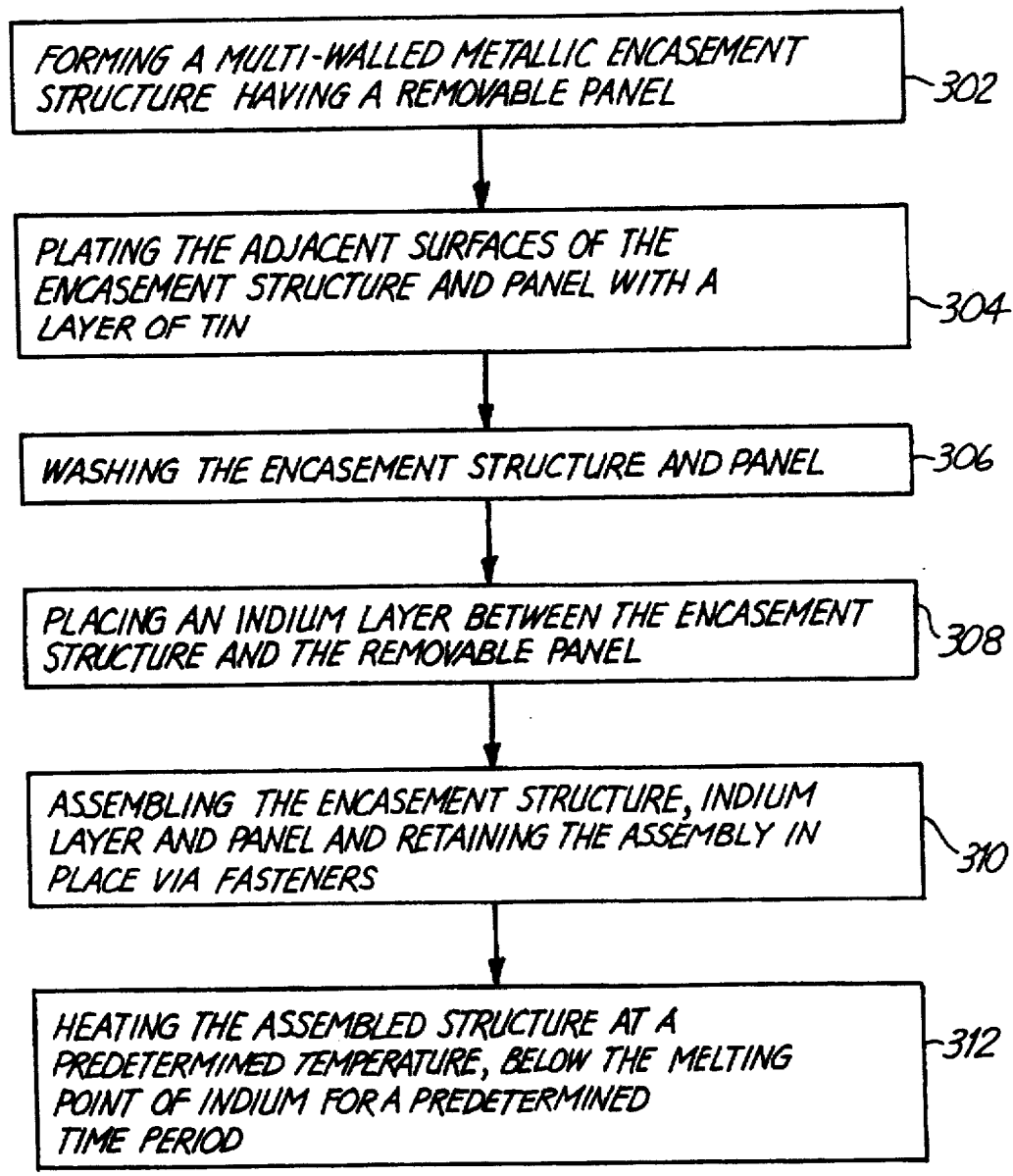
FIG. 3 illustrates a flow chart of a method of forming a hermetic seal device in accordance with the teachings of the present invention.

In FIG. 3, a flow chart illustrating the method of assembly of the present invention is shown. An initial step 302 comprises the forming of the multiwalled encasement structure, including its associated lid element. Subsequent to the formation, a tin plating operation is performed on the lid element and the multiwalled encasement structure, step 304. it is understood, as described above, that the plating operation must include all areas where indium and the multiwalled encasement structure are in contact, but normally would include the entire structure. Subsequent to the plating process, the encasement structure and lid are subjected to standardized industrial cleaning, including acid rinses or the like, so as to provide as clean a surface as possible. Step 308, an indium metallic layer, is disposed between the multiwalled encasement structure and its lid and the apparatus is mechanically assembled. The lid element and the multiwalled encasement structure are held in contact via mechanical pressure, Step 310. Finally, a curing process, Step 312, occurs via the baking of the entire apparatus at a selected temperature below the melting point of the indium-tin intermetallic for a given period of time. It is understood the time period could vary depending upon physical dimensions of the multiwalled encasement structure and the selected temperature. By utilizing the method described above, one can readily obtain a hermetic sealed canister which will provide stringent environmental protection for components otherwise ineligible for inclusion in apparatus requiring survivability under such conditions.

While particular embodiments of the present invention have been shown and described, it should be clear that changes in modifications may be made to such embodiments without departing from the true spirit from the invention. It is intended that the appended claims cover all such changes and modifications.

I claim:

1. A hermetic sealed canister comprising:

a multiwalled encasement structure having an external surface and an opening for receiving a component to be enclosed therein;

a lid element having an external surface and complementary in dimension to the multiwalled encasement structure opening, thereby forming a complete enclosure for the component;

electrical connectors attached to one or more walls of the multiwalled encasement structure;

an indium gasket disposed between the lid element and the multiwalled encasement structure thereby forming a tin and indium interface; and a plurality of fasteners for rigidly engaging the lid onto the multiwalled encasement structure; wherein the external surfaces of the lid and the multiwalled encasement structure are tin plated; and wherein the complete enclosure is subjected to sustained heating at a predetermined temperature and time such that the tin and indium interface is structurally transformed into a metallurgical intermetallic bond layer that is highly impermeable to potential environmental contaminants.

2. The apparatus of claim 1, wherein each of said plurality of fasteners is a machine screw.

3. The apparatus of claim 1, wherein each of said plurality of fasteners are spaced in equidistant fashion from each other.

4. The apparatus of claim 1, wherein the multiwalled encasement structure and the lid are comprised of tin-plated aluminum.

5. A hermetic sealed canister comprising:

a tin plated multiwalled encasement structure having an external surface and an opening for receiving a component to be enclosed therein;

a tin plated lid element, having an external surface that is complementary in dimension to the tin plated multiwalled encasement structure opening, thereby forming a complete enclosure for the component having a set of apertures for allowing passage of a corresponding set of fasteners, the tin plated lid element having an integral boss on its surface adjacent to the tin plated multiwalled encasement structure;

electrical connectors attached to one or more walls of the tin plated multiwalled encasement structure;

an indium gasket disposed between the tin plated lid element and the tin plated multiwalled encasement structure that under pressure and predetermined temperature provides a tin and indium intermetallic bond layer; and a plurality of fasteners for rigidly engaging the lid onto the multiwalled encasement structure.

6. The apparatus of claim 5, wherein each of said plurality of fasteners is a machine screw.

7. The apparatus of claim 5, wherein each of said plurality of fasteners are spaced in equidistant fashion from each other.

8. The apparatus of claim 5, wherein the multiwalled encasement structure and the lid are comprised of aluminum.

* * * * *